United States Patent [19]

Leber et al.

[11] Patent Number: 4,891,586
[45] Date of Patent: Jan. 2, 1990

[54] IC GRABBER PROBE

[75] Inventors: David C. Leber; William B. Tuff, both of Vancouver, Wash.; Paul L. Verstrate, Cornelius, Oreg.

[73] Assignee: Tektronix, Inc., Beaverton, Oreg.

[21] Appl. No.: 310,403

[22] Filed: Feb. 13, 1989

[51] Int. Cl.$^4$ .............................................. G01R 1/06
[52] U.S. Cl. .................................. 324/158 P; 324/72.5
[58] Field of Search ........................... 324/158 P, 72.5; 439/391, 417, 482

[56] References Cited

U.S. PATENT DOCUMENTS

| | | | |
|---|---|---|---|
| 3,201,746 | 8/1965 | Askew | 324/72.5 |
| 3,893,027 | 7/1975 | Veenendaal | 324/72.5 |
| 3,996,511 | 12/1976 | Baer | 324/72.5 |
| 4,263,547 | 4/1981 | Johnson | 324/72.5 |
| 4,659,987 | 4/1987 | Coe et al. | 324/158 P |

Primary Examiner—Ernest F. Karlsen
Attorney, Agent, or Firm—William K. Bucher

[57] ABSTRACT

An electrical test probe has a electrically conductive hollow elongate body with an exterior coating of electrically insulative material. An output connector is formed by soldering an electrically conductive wire to the exterior of the elongate body. A hooked gripping tip for probing Integrated circuit devices and the like is formed on one end of a conductive shaft inserted into the elongate body. Axial movement of the conductive shaft relative to the elongate body alternately extends and retracts the hooked gripping tip out of and into the elongate body. The electrically conductive elongate body provides a low contact resistance path between the gripping tip and the output connector.

11 Claims, 2 Drawing Sheets

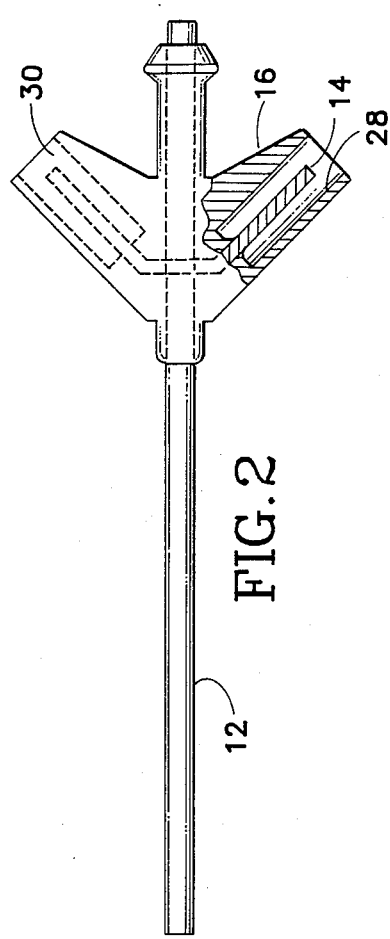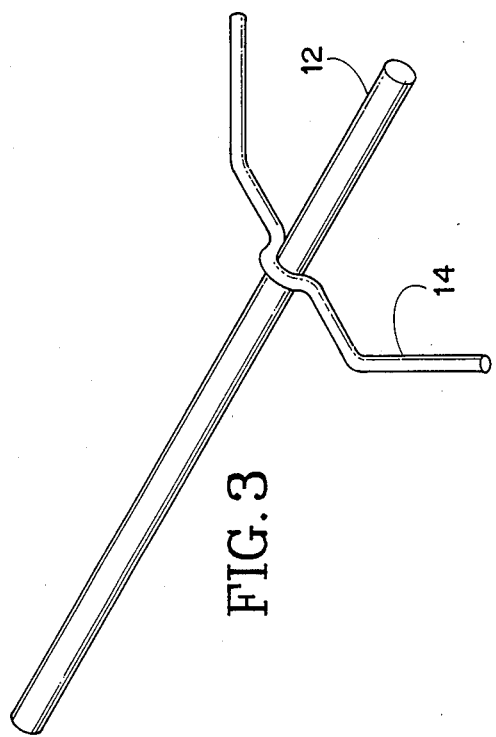

IC GRABBER PROBE

BACKGROUND OF THE INVENTION

The present invention is directed to electrical test probe, and more specifically to a miniature electrical test probes suitable for use with both surface mounted and lead-mounted electrical components.

As the size of electrical components decreases, it becomes progressively more difficult to place electrical test probes on the leads of these components. Presently, electrical probe bodies typically are formed from injected molded plastic and are of a size that does not permit the attachment of multiple such probes to integrated circuit (IC) leads spaced on 0.050 inch centers. Attempts to decrease the diameter of the elongated nose portion of a typical probe along with the overall size of the probe body produce an increase in the internal electrical resistance of the probe. This is due to the decreased cross-sectional area of the conductive elements within the probes.

One example of a prior art electrical probe intended for use in probing IC leads is the "IC grabber tip" sold by Tektronix, Inc. as part number 020-1386-00. This prior art probe has a molded plastic body with a hollow elongate nose portion housing an axially movable conductor wire. A hook formed at one end of the conductor is used for "grabbing" an IC lead. A biasing spring connected to the conductor wire at the end opposite the grabber tip retracts the grabber tip into the probe body when it is not connected to an IC lead or other device. The size of the molded probe body is to large to permit placement of several such probes on adjacent leads of a small IC package. In addition, the internal resistance of this prior art probe design is in the hundreds of milliohms, a level that is detrimental to accurate signal acquisition and measurement.

What is needed is an electrical test probe that has substantially reduced internal resistance while at the same time is small enough to permit the connection of multiple probes to adjacent leads of miniature electronic components, such as surface mounted devices and integrated circuits.

SUMMARY OF THE INVENTION

An electrical probe provided in accordance with the present invention includes a body, an elongate, thin conductive shaft, and a contact means for attaching a test lead to the probe. The body includes an elongate, narrow tubular nose section having an electrically conductive inner surface and an electrically insulative outer surface. The conductive shaft has a gripping means, such as a C-shaped hook, adjacent one end for establishing gripping contact with a probed device. The shaft is located within the nose section for axial movement therein for alternately extending the gripping means from and retracting the same into one end of the nose section. The shaft includes a means for maintaining low resistive contact with the inner surface of the nose section during such movement. The contact means is in electrical contact with the inner surface of the nose section and is proximate the end of the nose section opposite the end adjacent the gripping means.

The objects, advantages and novel features of the present invention are apparent from the following detailed description when read in conjunction with the appended claims and attached drawings.

BRIEF DESCRIPTION OF THE DRAWINGS

FIG. 2 is a detailed view of the body of the FIG. 1 probe incorporating the present invention; and FIG. 3 is an enlarged perspective view of an interconnection between a conductor wire and an elongate tube within FIG. 2.

DETAILED DESCRIPTION

Figure 1:
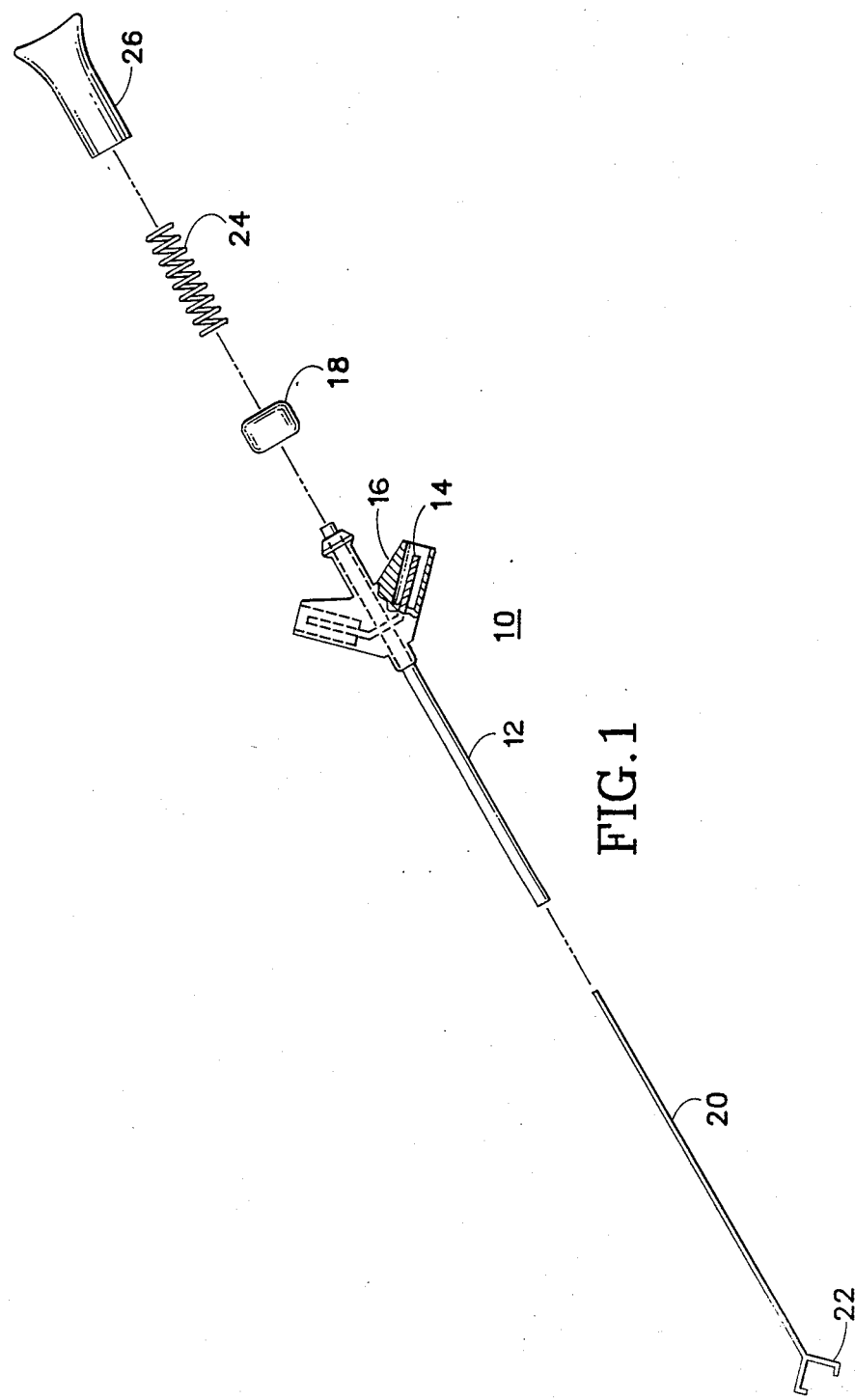
FIG. 1 is an exploded view of an electrical probe according to the present invention.

Referring to FIG. 1, there is shown an exploded view of the electrical probe according to the present invention. Probe 10 includes a body 12 having an elongate, narrow tubular nose section that has an electrically conductive inner surface and an electrically insulative outer surface coating over a substantial portion of its length. Secured to an uninsulated outer surface portion of the body 12 and in electrical contact with the inner surface is a contact means 14 in the form of a metallic conductor wire for attaching a test lead to the probe 10. Conductor wire 14 has a central portion coextensive with the outer surface of body 12 and two end portions forming winged extensions from body 12. Conductor wire 14 is positioned proximate one end of the body 12, defining a short end of body 12. The winged end portions of conductor wire 14 are directed toward the short end and away from the nose section of body 12. Surrounding the conductor wire 14 and the short end of body 12 is an insulative housing 16, such as formed by an injected molding process. A push-button retainer 18 having a central aperture is slideably positioned over the sort end of body 12 that is covered by the insulative housing 16. A elongate, thin conductive shaft 20 is positioned within body 12 and is of such length that a portion of the conductive shaft 20 protrudes from the short end of body 12. A biasing spring 24 is positioned on the protruding conductor shaft 20 and is secured by bending the end of the shaft 20 over spring 24. A push-button 26 having a central aperture approximately equal to the dimensions of biasing spring 24 is placed over spring 24 and secured into push-button retainer 18. Axial movement of conductive shaft 20 within body 12 is accomplished by axial movement of push-button 26.

In the preferred embodiment, conductive shaft 20 is made of two flat wires that are butt welded along a central portion of their length. Gripping means in the form of C-shaped hooks 22 are formed on the ends of the wires. The C-shaped hooks 22 are positioned proximate the nose section end of body 12 for establishing conductive gripping contact with a probed device. During probing of an IC package, surface mounted device, or the like, axial pressure applied to the push-button 26 causes compression of spring 24 and axial movement of conductor shaft 20 within body 12 exposing the C-shaped hooks 22 on the ends of the conductor shaft 20 at the end of the nose section. The C-shaped hooks are placed around a lead of the device being probed and the pressure on the pushbutton 26 is released causing the compressed spring 24 to expand and retract the C-shaped hooks 22 within the nose section of body 12 gripping the lead within the hooks. As the C-shaped hooks 22 axially move in and out of the nose section of body 12, low resistance contact is maintained between the conductor shaft 20 and the inner surface of the nose section by the pressing of a portion of the C-shaped hooks 22 against the inner surface of body 12.

Referring to FIG. 2, there is shown a detailed view of body 12, contact means 14, and insulative housing 16. In the preferred embodiment, the body 12 is made from tubular brass having an overall length of approximately 1.7 inches, an outside diameter of 0.05 inches, and an inside diameter of 0.04 inches. An epoxy resin coating, for example EF-T-403-S-1 epoxy resin powder manufactured by Fuller, is applied to the exterior surface of the tubular brass body 12 starting from a point 0.6 inches from either end of the brass tube. The electrically insulative epoxy coating has a thickness of approximately 0.002 inches.

At approximately 1.5 inches from the end of the brass tube 12 having the epoxy coating is positioned the contact means 14 in the form of the electrical conductor wire. In the preferred embodiment, conductor wire 14 is a solid CuBe wire with a diameter of 0.025 inches. The wire is plated with a minimum of 0.00001 inches of gold over a minimum of 0.0003 inches of nickel. As was previously described, conductor wire 14 has a central portion and two winged end portions. As is shown in the perspective view of FIG. 3, the central portion of conductor wire 14 is centered over the brass tube 12 and bent to conform to the radius of the tube 12. Conductor wire 14 is soldered to the brass tube 12 using a KESTER type R-540 OA 63/37PB solder paste or equivalent.

Encapsulating and electrically insulating conductor wire 14 and the short section of elongate body 12 is the insulative housing 16 made of CYCOLAC GSM ABS or like material and formed by an injection molding process. Cavities 28 and 30 are molded in housing 16 in line with the winged portions of conductor wire 14. The exposed ends of conductor wire 14 within cavities 28 and 30 are used as output connections for probe 10.

The use of the electrically conductive brass tube for the body 12 in the electrical probe 10 provides a low resistance path between the C-shaped hooks 22 of the conductive shaft 20 and the electrical conductor wire 14 affixed to the exterior of body 12. In addition, the tubular brass used for the body 12 is bendable without the loss of the low contact resistance path between the C-shaped hooks 22 and the conductor wire 14. This permits the placement of multiple probes of this design within a small area, such as leads on an IC or surface mounted devices.

Alternate designs and modifications to the preferred embodiment of the present invention can be made without departing from the scope of the appended claims. For example, the contact means for probe 10 could be formed from brass tubing affixed to and in electrical contact with the exterior surface of the elongate member 12 instead of the soldered conductor wire 14. A further modification of this design would have the conductive shaft 20 within body 12 exposed within the affixed brass tubing with both acting as the contact means.

An electrical probe has been described having an electrically conductive elongate body coated with an electrically insulative material. A conductor wire is soldered to the exterior of the elongate body for use as an output connector. A conductive shaft having a hooked gripping tip on one end for establishing gripping contact with a probed device is inserted into the elongate body in electrical contact with the interior surface of the body. Axial movement of the conductive shaft relative to the elongate body alternately extends the hooked gripping tip from and retracts the same into the elongate body. The electrically conductive elongate body provides a low resistance path between the gripping tip and the output conductor wire. These and other aspects of the present invention are set forth in the appended claims.

We claim:
1. An electrical probe, comprising
   a body including an elongate, narrow tubular nose section having an electrically conductive inner surface and an electrically insulative outer surface,
   an elongate, thin conductive shaft having gripping means adjacent one end thereof for establishing conductive, gripping contact with a probed device, said shaft being received within said nose section for axial movement relative thereto alternately to extend said gripping means from and retract the same into one end of said nose section, said shaft including means for maintaining low resistance contact with the inner surface of said nose section during such movement, and
   contact means proximate the opposite end of said nose section and in electrical contact with said inner surface for attaching a test lead to said probe.

2. The probe of claim 1, further including means defining an insulative housing containing said contact means.

3. The probe of claim 1, wherein said nose section comprises a metal tube having an electrically insulative outer surface coating over a substantial portion of its length.

4. The probe of claim 3, wherein said outer surface coating is a polymer coating.

5. The probe of claim 3, wherein said metal is a copper alloy.

6. The probe of claim 3, wherein said contact means comprises a metallic member secured to an uninsulated outer surface portion of said metal tube.

7. The probe of claim 6, wherein said metallic member is soldered to said tube.

8. The probe of claim 3, wherein said shaft comprises an elongate metal wire having a hook formed therein adjacent one end thereof.

9. The probe of claim 3, wherein said shaft comprises a plurality of metal wires, each having a hook formed therein adjacent one end thereof.

10. The probe of claim 8, wherein a portion of said hook presses against the inner surface of said tube to maintain a low resistance contact therebetween when a probed device is gripped by said gripping means.

11. The probe of claim 1, wherein said narrow tubular nose section is bendable without the loss of said low resistance contact between said shaft and said inner surface of said nose section.

* * * * *